(12) United States Patent
Takahata (10) Patent No.: US 7,336,130 B2
(45) Date of Patent: Feb. 26, 2008

(54) ATTENUATOR, VARIABLE GAIN AMPLIFIER USING THE SAME, AND ELECTRONIC EQUIPMENT

(75) Inventor: Koji Takahata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 131 days.

(21) Appl. No.: 11/380,551

(22) Filed: Apr. 27, 2006

(65) Prior Publication Data

US 2006/0244549 A1 Nov. 2, 2006

(30) Foreign Application Priority Data

Apr. 28, 2005 (JP) .............................. 2005-133335

(51) Int. Cl.
*H03G 3/00* (2006.01)
(52) U.S. Cl. ...................... 330/284; 330/279; 330/281; 333/81 R; 381/104
(58) Field of Classification Search ................ 330/284, 330/279, 281, 282; 333/81 R; 381/104
See application file for complete search history.

(56) References Cited

U.S. PATENT DOCUMENTS

| 3,969,683 | A | * | 7/1976 | Fabricius | 330/144 |
| 4,306,113 | A | * | 12/1981 | Morton | 381/58 |
| 4,451,795 | A | * | 5/1984 | Kilian | 330/107 |
| 5,764,103 | A | * | 6/1998 | Burra et al. | 330/51 |
| 5,861,774 | A | * | 1/1999 | Blumenthal | 330/2 |
| 7,078,964 | B2 | * | 7/2006 | Risbo et al. | 330/10 |

FOREIGN PATENT DOCUMENTS

JP 2003-125369 A 4/2003
JP 2004-336129 11/2004

* cited by examiner

*Primary Examiner*—Patricia Nguyen
(74) *Attorney, Agent, or Firm*—Keating & Bennett, LLP (57) ABSTRACT

An attenuator attenuates input signals and outputs the signals to an amplifier arranged to amplify signals applied to two input terminals. The attenuator includes first and second output terminals to be respectively connected to the two input terminals of the amplifier, a comparison determination circuit arranged to compare a data variable corresponding to a current attenuation factor with target data corresponding to an attenuation factor as a target value, to output an up signal or a down signal, and an up-down counter arranged to increase or decrease the data variable based upon the up signal or the down signal which is outputted from the comparison determination circuit. The input signals respectively attenuated by different attenuation factors are outputted to the first and second output terminals based upon the data variable outputted from the up-down counter. Since the attenuation factor changes in a stepwise manner by the provision of target data alone from the outside which corresponds to the attenuation factor as the target value, signal distortion is minimized.

20 Claims, 7 Drawing Sheets

ATTENUATOR, VARIABLE GAIN AMPLIFIER USING THE SAME, AND ELECTRONIC EQUIPMENT

BACKGROUND OF THE INVENTION

1. Field of the Invention

The present invention relates to a gain control technique of a variable gain amplifier.

2. Description of Related Art

In an audiovisual apparatus, an audio signal amplifier is used in order to amplify an audio signal that is a weak electric signal and to supply the amplified signal to a sound output device such as a speaker or an earphone. In such an audio signal amplifier, a gain is changed to adjust a volume. For such adjustment of sound, for example, a variable gain amplifier described in Japanese Patent Application Laid-Open No. 2004-336129 is used.

In an audio signal amplifier, when a signal amplitude becomes discontinuous at the time of changing a gain, an unpleasant noise such as a click sound or the like is emitted from a speaker, so as to stimulate an auditory sense of a person listening to an audio.

In order to reduce such a click sound, it is necessary to modestly change the gain of the audio signal amplifier. A time constant circuit including a capacitor is used for gradually changing the gain of the audio signal amplifier. This time constant circuit produces a voltage that increases or decreases based on the charge/discharge of the capacitor. Based upon this voltage, the gain of the audio signal amplifier is controlled.

Here, a gain control of the audio signal amplifier is considered. A microcomputer is provided in electronic equipment with the audio signal amplifier provided therein. This microcomputer controls the gain of the audio signal amplifier. Here, the case of switching the gain to a large degree in the conventional audio signal amplifier is considered. For example, when a gain of an audio signal amplifier capable of switching a gain in 50 steps is to be switched from the largest gain to the smallest gain, switching the gain all at once causes distortion of an audio signal. Therefore, a control of switching the gain in a stepwise manner is performed by the microcomputer to prevent distortion of the audio signal. However, the problem of an increasing load of the microcomputer occurs when the gain of the audio signal amplifier is under software control by the microcomputer.

SUMMARY OF THE INVENTION

In order to overcome the problems describe above, preferred embodiments of the present invention provide an attenuator and a variable gain amplifier which switch an attenuation factor or a gain in a stepwise manner in a circuit.

A preferred embodiment of the present invention relates to an attenuator which attenuates input signals and outputs the signals to an amplifier arranged to amplify signals applied to two input terminals. The attenuator preferably includes first and second output terminals to be respectively connected to the two input terminals of the amplifier, a comparison determination circuit arranged to compare a data variable corresponding to a current attenuation factor with target data corresponding to an attenuation factor as a target value, to output an up signal or a down signal, and an up-down counter arranged to increase or decrease the data variable based upon the up signal or the down signal which is outputted from the comparison determination circuit, wherein the input signals respectively attenuated by different attenuation factors are outputted to the first and second output terminals based upon the data variable outputted from the up-down counter.

According to this preferred embodiment, since the attenuation factor changes in a stepwise manner by the provision of target data alone from the outside which corresponds to the attenuation factor as the target value, signal distortion is minimized.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Various preferred embodiments of the present invention will be described in the following paragraphs with reference to the drawings.

It should be noted that in the present specification, an input terminal or an output terminal is not limited and does not refer to a pad of an LSI, but refers to one point in a circuit.

Figure 1:
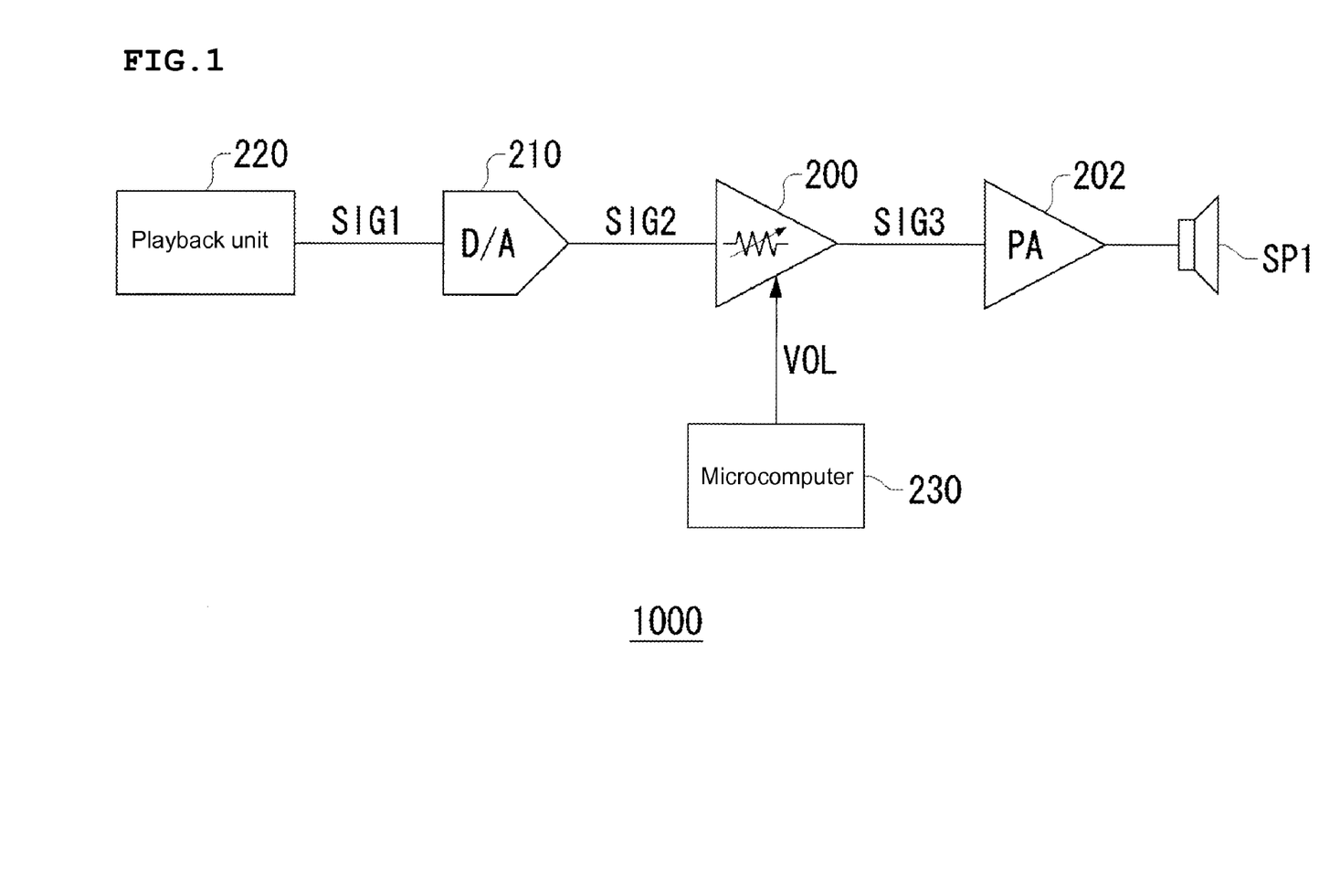
FIG. 1 is a block diagram showing a configuration of an audio signal output device for which a variable gain amplifier according to a preferred embodiment of the present invention is used.

FIG. 1 is a block diagram showing a configuration of an audio signal output device for which a variable gain amplifier according to a preferred embodiment of the present invention is used. An audio signal output device 1000 preferably includes a variable gain amplifier 200, a power amplifier 202, a D/A converter 210, a playback unit 220, a microcomputer 230 and a speaker SP1.

This audio signal output device may be preferably used, for example, as an audio device for automobile use.

The playback unit 220 may preferably be a CD player, an MD player or some other type of digital audio player, which reads sound data recorded on a disc or other media as digital data. The playback unit 220 outputs a digital signal SIG1, obtained by decoding the digital data, to the D/A converter 210. The D/A converter 210 D/A converts the digital signal SIG1 to an analog signal SIG2 to be outputted.

The variable gain amplifier 200 amplifies an analog signal SIG 2 and outputs this signal to the power amplifier 202. The microcomputer 230 controls a gain of the variable gain amplifier 200 via a volume control signal VOL.

The power amplifier 202 amplifies an analog signal SIG 3 outputted from the variable gain amplifier 200, to drive the speaker SP1. The change in gain of the variable gain amplifier 200 controls amplitudes of an input signal and an output signal of the power amplifier 202, to adjust a volume of sound outputted from the speaker SP1.

Figure 2:
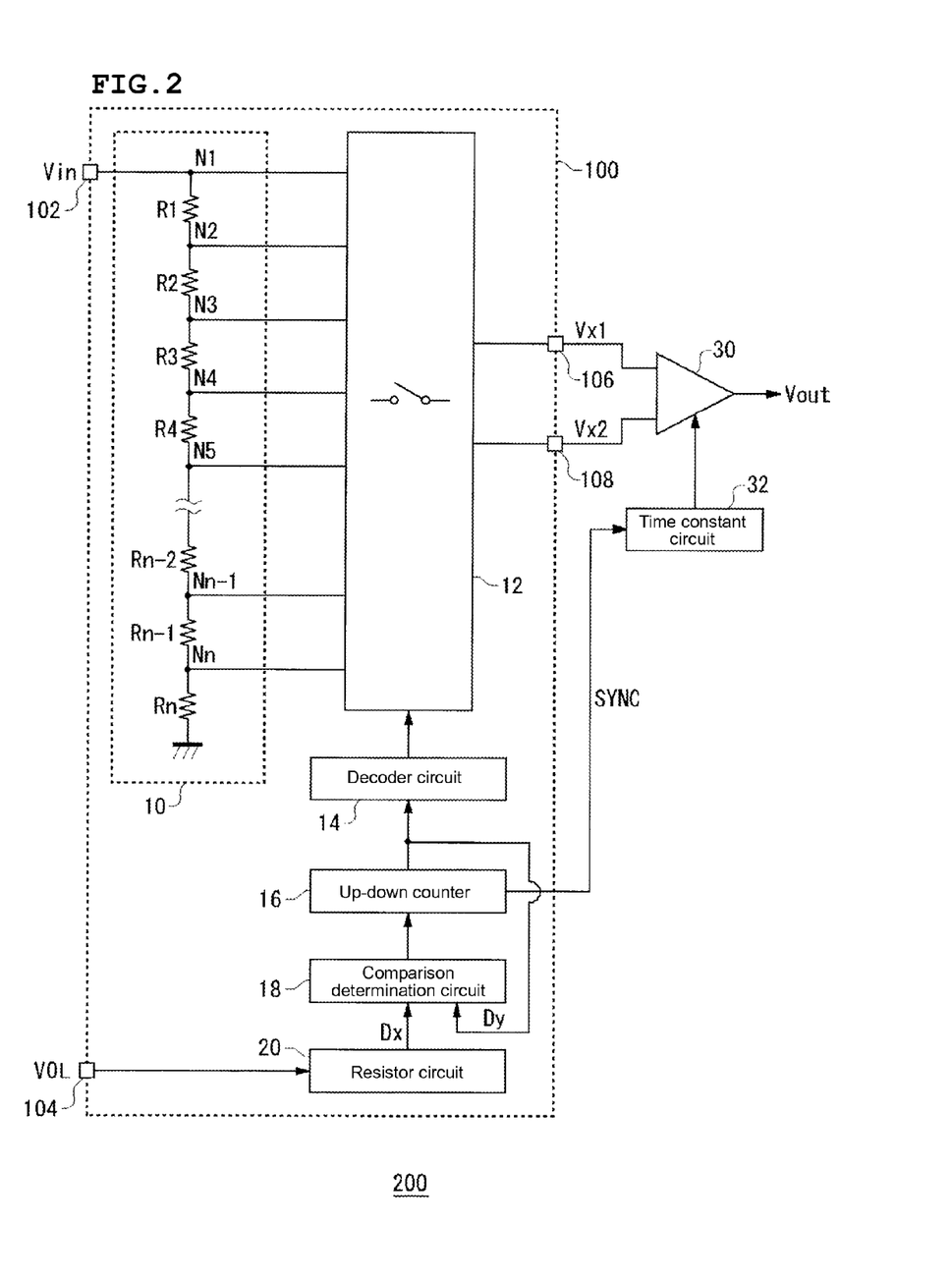
FIG. 2 is a block diagram showing a configuration of the variable gain amplifier.

FIG. 2 is a block diagram showing a configuration of the variable gain amplifier 200 according to the present preferred embodiment. The variable gain amplifier 200 preferably includes an attenuator 100, an amplifier 30 and a time constant circuit 32. The variable gain amplifier 200 is preferably integrally integrated on one semiconductor substrate, however other suitable constructions of the variable gain amplifier 200 may be used.

The attenuator 100 attenuates an input signal Vin, and outputs a first output signal Vx1 and a second output signal Vx2 to an amplifier 30 arranged to amplify signals applied to two input terminals. Although details are described later, the amplifier 30 preferably includes two input terminals and includes two amplification portions arranged to respectively amplify the first output signal Vx1 and the second output signal Vx2 which are applied to the respective input terminals. The amplifier 30 is capable of continuously switching either of the two amplification parts to active.

The attenuator 100 preferably includes, as input and output terminals, an input terminal 102, a volume control terminal 104, a first output terminal 106, and a second output terminal 108. The input signal Vin to be attenuated is inputted into the input terminal 102. The input signal Vin corresponds to the analog signal SIG2 which is outputted from the D/A converter 210 of FIG. 1.

The volume control signal VOL which is outputted from the microcomputer 230 of FIG. 1 is inputted into the volume control terminal 104. The attenuator 100 switches an attenuation factor based upon this volume control signal VOL, attenuates the input signal Vin, and then outputs the signal to the amplifier 30.

The first output terminal 106 is a terminal arranged to output the first output signal Vx1 to one of the input terminals of the amplifier 30 in a subsequent step, and the second output terminal 108 is a terminal arranged to output the second output signal Vx2 to the other input terminal of the amplifier 30.

The attenuator 100 preferably includes a resistance group 10, a switch group 12, a decoder circuit 14, an up-down counter 16, a comparison determination circuit 18, and a resistor circuit 20.

The resistance group 10 includes a plurality of resistances R1 to Rn which are connected in series. The input signal Vin is applied to one end of the resistance group 10 and the other end thereof is grounded. The resistance group 10 functions as a resistance voltage divider circuit, and voltages into which the input signal Vin was divided respectively appear at connection nodes N1 to Nn of the plurality of resistances R1 to Rn. The nodes N1 to Nn of the resistance group 10 are connected to the switch group 12.

Figure 3:
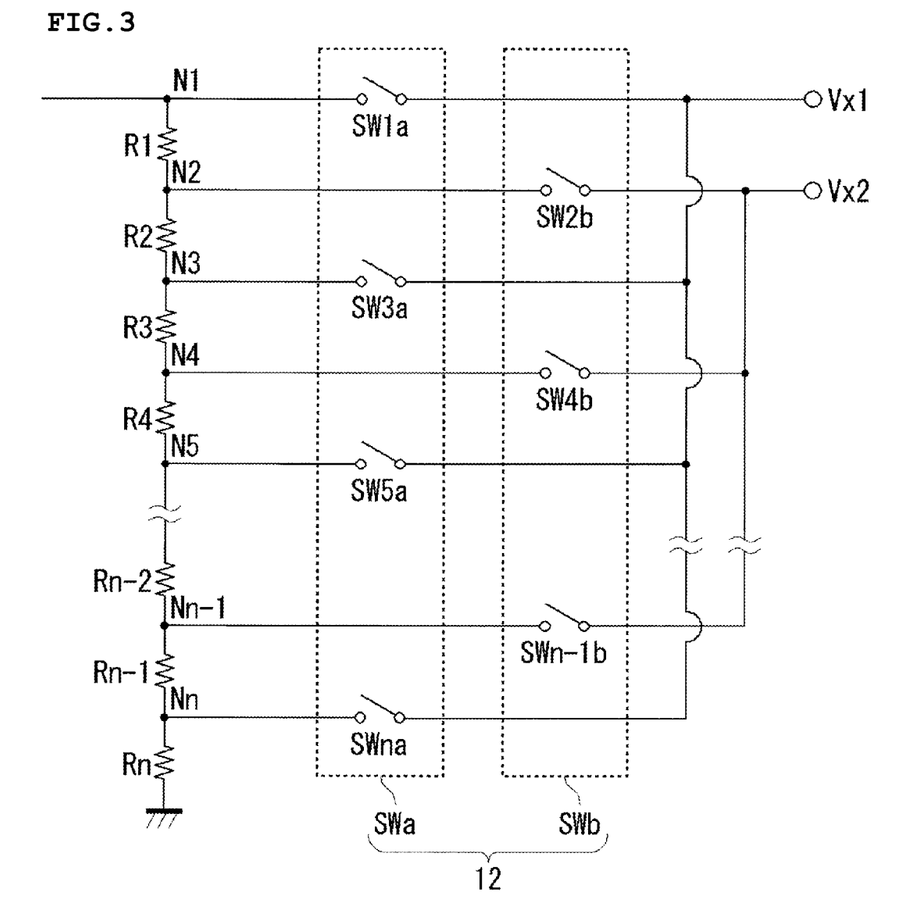
FIG. 3 is a view showing an internal configuration of a switch group of FIG. 2.

FIG. 3 is a view showing an internal configuration of the switch group 12. The switch group 12 preferably includes: a plurality of switches SW1a, SW3a, SW5a, . . . , SWna which are collectively referred to as a first switch group SWa; and plurality of switches SW2b, SW4g, SW6b, . . . , SW(n-1)b which are collectively referred to as a second switch group SWb.

The switches in the first switch group SWa are provided between the first output terminal 106 and the connection nodes N1 to Nn. The switches in the second switch group SWb are provided between the second output terminal 108 and the connection nodes N1 to Nn.

The plurality of switches included in the first switch group SWa and those included in the second switch group SWb are alternately connected to the connection nodes N1 to Nn of the plurality of the resistances R1 to Rn. More specifically, the first output terminal 106 is connected to either one of the odd-numbered connection nodes, and the second output terminal 108 is connected to any one of the even-numbered connection nodes.

The description returns to FIG. 2. The volume control signal VOL which is outputted from the microcomputer 230 and inputted into the volume control terminal 104 is written in the resistor circuit 20.

The comparison determination circuit 18 is connected to the resistor circuit 20, and reads the volume control signal VOL written into the resistor circuit 20, as digital data Dx. This digital data Dx is data that defines a target value of the attenuation factor of the attenuator 100. Further, digital data Dy corresponding to a current attenuation factor is inputted into the comparison determination circuit 18. The comparison determination circuit 18 compares the digital data Dx with the digital data Dy, and outputs, to the up-down counter 16, an up signal when Dx>Dy, a down signal when Dx<Dy, and a stop signal when Dx=Dy.

The up-down counter 16 increases or decreases the digital data Dy based upon the up signal or the down signal which are outputted from the comparison determination circuit 18. More specifically, the digital data Dy is increased by one when the up signal is inputted, and is decreased by one when the down signal is inputted. The up-down counter 16 and the comparison determination circuit 18 make the digital data Dy, which is outputted to the switch group 12, close to the digital data Dx as the target value.

The decoder circuit 14 selects one switch each of the first and second switch groups SWa and SWb, which corresponds to the digital data Dy outputted from the up-down counter 16, and then turns on that switch. The decoder circuit 14, for example, makes the digital data Dy and the connection node N correspond to each other. More specifically, when the digital data Dy=i is an odd number, an i-st switch SWia is turned on and the other switches are turned off in the first switch group SWa, while the connection states of the switches are held in the second switch group. When the digital data Dy=i is an even number, the i-st switch SWib is turned on and the other switches are turned off in the second switch group, while the connection states of the switches are held in the first switch group SWa.

Since being continuously changed by the counter 16, the digital data Dy belongs to the first and second switches and the two switches adjacent to each other are simultaneously turned on. As a result, the first output signal Vx1 and the second output signal Vx2 which respectively appear at the first output terminal 106 and the second output terminal 108 are signals obtained by attenuation of the input signal Vin with different attenuation factors and having different amplitudes.

Figure 4:
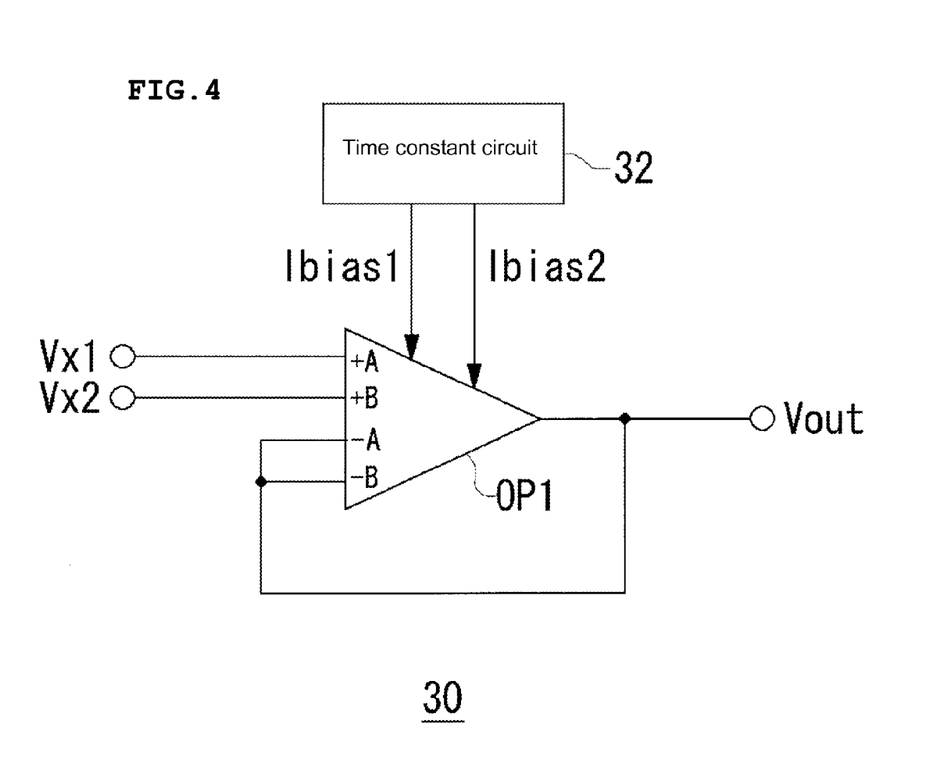
FIG. 4 is a circuit diagram showing an amplifier and a time constant circuit of FIG. 2.

What was described above is a preferred configuration of the attenuator 100. Next, a preferred configuration of the amplifier 30 is described. FIG. 4 is a circuit diagram showing the amplifier 30 and the time constant circuit 32. The amplifier 30 is preferably a voltage follower circuit using an operational amplifier OP1 including two differential input terminals, and an output terminal of the operational amplifier OP is connected to inverting input terminals thereof through a feedback route.

Figure 5:
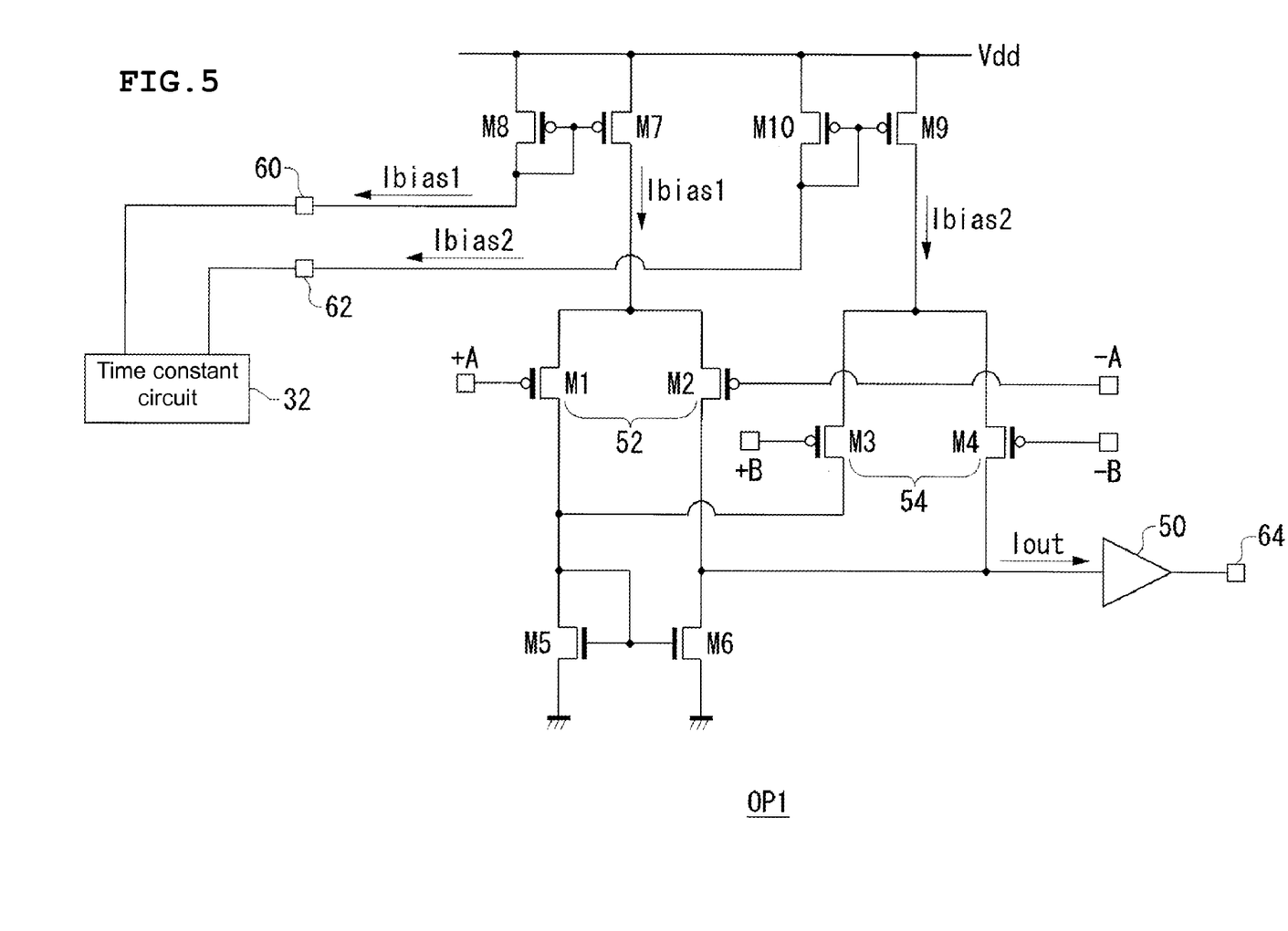
FIG. 5 is a circuit diagram showing a configuration of an operational amplifier for use in the amplifier of FIG. 4.

FIG. 5 is a circuit diagram showing a preferred configuration of the operational amplifier OP1 for use in the amplifier 30. This operational amplifier OP1 preferably includes two pairs of differential input terminals. Hereinafter, the first differential input terminal is referred to as an A-channel and the second differential input terminal is referred to as a B-channel.

The operational amplifier OP1 includes transistors M1 to M10, and an output amplifier 50.

The operational amplifier OP1 preferably includes two differential pairs, more specifically, a first differential pair 52 which includes the transistors M1 and M2 and corresponds to the A-channel, and a second differential pair 54 which includes the transistors M3 and M4 and corresponds to the B-channel.

The transistors M1 to M4 are preferably P-channel MOS transistors. The respective gate terminals of those respective transistors are a first non-inverting input terminal (+A), a first inverting input terminal (−A), the second non-inverting input terminal (+B) and the second inverting input terminal (−B).

The first differential pair 52 including the transistors M1 and M2 is connected to the transistor M7 as a tail current source. The transistor M7 is preferably a current-mirror connected to the transistor M8. The transistors M7 and M8 are preferably P-channel MOS transistors, and a drain terminal of the transistor M8 is connected to a first current supply terminal 60.

Similarly, the second differential pair 54 including the transistors M3 and M4 is connected to the transistor M9. The transistor M9 is current-mirror connected to the transistor M10. A drain terminal of the transistor M10 is connected to a second current supply terminal 62. The first current supply terminal 60 and the second current supply terminal 62 are connected to the time constant circuit 32. The time constant circuit 32 produces a first bias current Ibias1 and a second bias current Ibias2 which complementarily increases or decreases according to a time constant.

Consequently, the first bias current Ibias1 as the tail current flows through the first differential pair 52, and the second bias current Ibias2 as the tail current flows through the second differential pair 54.

The transistors M5 and M6 are preferably current mirror loads connected in common to the first differential pair 52 and the second differential pair 54. The transistors M5 and M6 are preferably N-channel MOS transistors, and source terminals are grounded while gain terminals are connected to a drain terminal of the transistor M5.

Further, the drain terminal of the transistor M5 is connected to drain terminals of the transistors M1 and M3. Similarly, a drain terminal of the transistor M6 is connected to drain terminals of the transistors M2 and M4.

The transistors M5 and M6 function as constant current loads of the first differential pair 52 and the second differential pair 54.

The drain terminal of the transistor M6 is connected to the output amplifier 50. The output amplifier 50 amplifies an output current Iout produced by the two differential pairs, and outputs the current from an output terminal 64. The output amplifier 50 may be configured to include an output step of a typical operational amplifier, namely an amplification step, and a buffer, and a circuit configuration thereof is not particularly restricted in the present preferred embodiment.

An operation of the operational amplifier OP1 as thus configured is described.

A mutual conductance gm1 of the first differential pair 52 is given by: $gm1=\sqrt{(\beta \times Ibias1)}$. Here, using a gate width W, a gate length L, a mobility μ, and a capacitance Cox of a gate oxide film, β is defined by: $\beta=W/L \times \mu Cox$. When a difference of voltages to be inputted into the first non-inverting input terminal (+A) and the first inverting input terminal (−A), namely a differential input voltage, is Vin1, a differential current Iout1, produced by the first differential pair, is calculated by: $Iout1=gm1 \times Vin1$.

Similarly, a mutual conductance gm2 of the second differential pair 54 is given by: $gm2=\sqrt{(\beta \times Ibias2)}$. When the differential input voltage is Vin2, a differential current Iout2, produced by the second differential pair, is calculated by: $Iout2=gm2 \times Vin2$.

The output current Iout amplified by the output amplifier step 50 is determined by the sum of the differential currents Iout1 and Iout 2 respectively produced by the first differential pair 52 and the second differential pair 54. That is, $Iout=Iout1+Iout2=gm1 \times Vin1+gm2 \times Vin2$.

As thus described, the mutual conductances gm1 and gm2 of the differential pairs are respectively determined as functions of the first bias current Ibias1 and the second bias current Ibias2. Therefore, in the operational amplifier OP1, control of the first bias current Ibias1 and the second bias current Ibias2 enables continuous switching of either the A-channel corresponding to the first differential pair 52 or the B-channel corresponding to the second differential pair 54, to active.

In the present preferred embodiment, the time constant circuit 32 controls the sum of the tail currents flowing through the first differential pair 52 and the second differential pair 54 to become a constant value Iss, and adjusts to make either the A-channel or the B-channel dominant according to which an amount of the tail current flowing through the first differential pair 52 or that flowing through the second differential pair 54 is increased.

For example, when Ibias1=0 and Ibias2=Iss, voltages to be inputted into the second non-inverting input terminal (+B) and the second inverting input terminal (−B) can be differentially amplified, while when Ibias1=Iss and Ibias2=0, voltages to be inputted into the first non-inverting input terminal (+A) and the first inverting input terminal (−A) can be differentially amplified. When the bias currents are supplied to both the first and second differential pairs, the respective differential input voltages of the A-channel and the B-channel are amplified in proportion to squares of the respective bias current.

The description returns to FIG. 4. A first output signal Vx1 and a second output signal Vx2 are respectively inputted into the first and second non-inverting input terminals of the operational amplifier OP1.

The time constant circuit 32 increase or decreases the first bias current Ibias1 and the second bias current Ibias2 at a predetermined time constant while keeping the currents in mutually complementary relation. At this time, in the amplifier 30, the A-channel and the B-channel of the operational amplifier OP1 are alternately switched to active.

As thus described, the first output signal Vx1 and the second output signal Vx2 are signals obtained by attenuation of the input signal Vin of the variable gain amplifier 200 with different attenuation factors and having different amplitudes. Therefore, when the operating state of the operational amplifier OP1 is switched from a state where the A-channel is active to a state where the B-channel is active, the amplitude of an output signal Vout is smoothly switched from the amplitude of the first output signal Vx1 to that of the second output signal Vx2.

Figure 6:
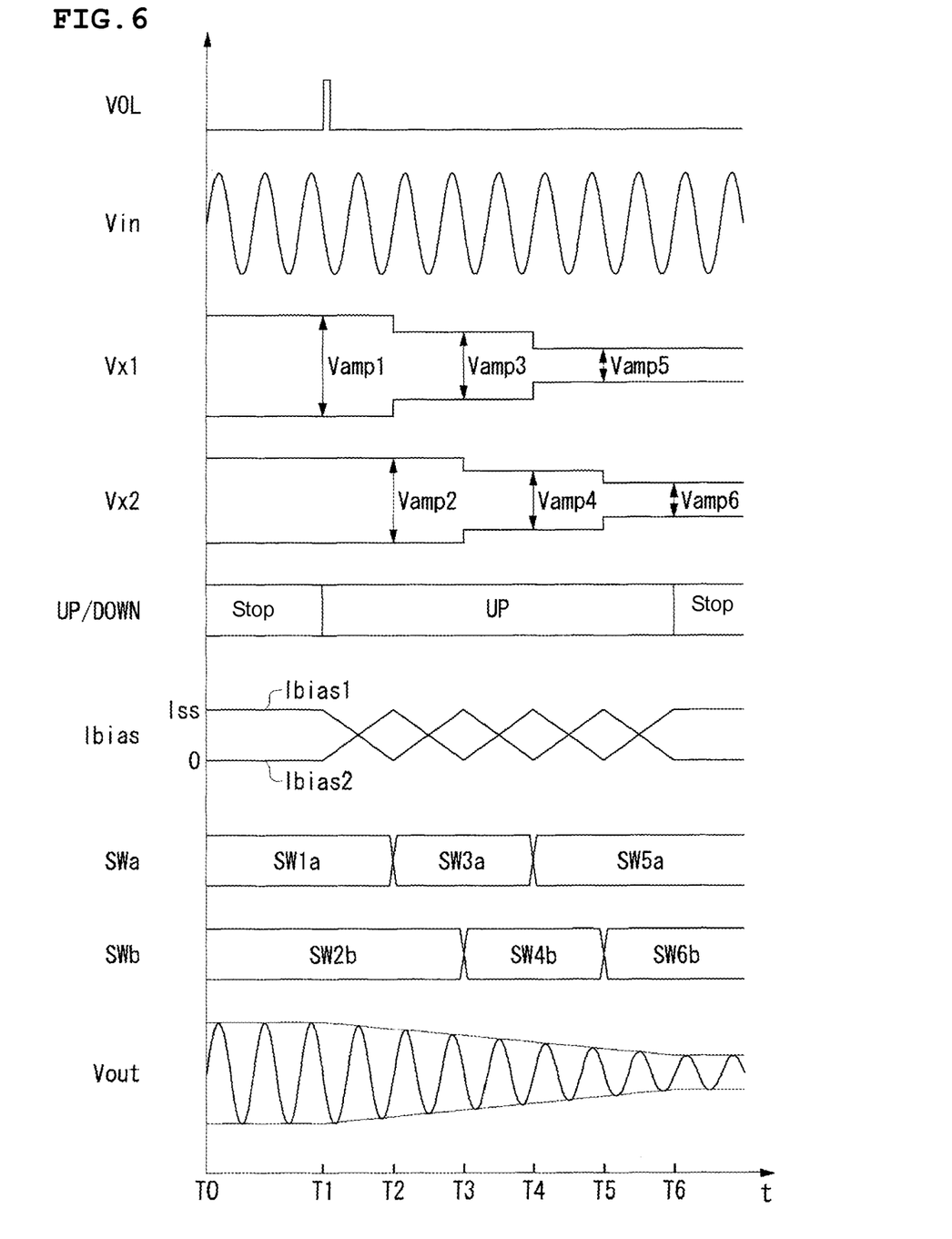
FIG. 6 is a time chart showing an operational state of the variable gain amplifier of FIG. 2.

An operation of the variable gain amplifier 200 configured as above is described. FIG. 6 is a time chart showing an operating state of the variable gain amplifier 200 according to the present preferred embodiment. The amplitude and frequency of the input signal Vin are regarded as constant for the sake of simplification of the description.

During a period from time T0 to time T1, a switch SW1*a* is on in the first switch group SWa, and a switch SW2*b* is on in the second switch group SWb. At this moment, the amplitudes of the first output signal Vx1 and that of the second output signal Vx2 are Vamp1 and Vamp2, respectively. The amplitude of the first output signal Vx1 is equivalent to that of the input signal Vin.

Further, the bias currents produced by the time constant circuit 32 are set to: Ibias1=Iss, Ibias2=0. In the operational amplifier OP1 of the amplifier 30, the A-channel is active. At this moment, the amplifier 30 amplifies the first output signal Vx1 by a gain of one and outputs the signal, and hence the gain (attenuation factor) of the variable gain amplifier 200 as a whole is 0 dB, namely one time. In this state, the digital data Dy which is outputted from the decoder circuit 14 and corresponds to the current attenuation factor is one. Further, a stop signal is outputted from the up-down counter 16.

A user lowers the volume at the time T1. The microcomputer 230 outputs a volume control signal VOL corresponding to a volume after the change to the variable gain amplifier 200. This volume control signal VOL is written into the resistor circuit 20. In FIG. 6, a case is described where digital data Dx corresponding to the volume after the change is six.

When the data of the resistor circuit 20 is rewritten, the comparison determination circuit 18 compares the digital data Dx with the digital data Dy. Since Dy<Dx in this state, the comparison determination circuit 18 outputs the up signal and the up-down counter 16 sets the digital data Dy to two. When the digital data Dy=2 is inputted, the decoder circuit 14 turns on the switch SW2*b* of the second switch group SWb. However, in the example shown in FIG. 6, the switch SW2*b* was previously turned on before the time T1. As a result, there is no change in the switch.

The up-down counter 16 outputs the up signal to the decoder circuit 14 and concurrently outputs a synchronized signal SYNC to the time constant circuit 32. Upon input of the synchronized signal SYNC, the time constant circuit 32 decreases the bias current Ibias1 according to the time constant, and increases the bias current Ibias2. The active channel of the operational amplifier OP1 is switched from A to B along with the change in bias current. More specifically, during the transition period of the time constant circuit 32 from the time T0 to the time T1, the amplitude of the output signal Vout of the variable gain amplifier 200 gradually changes from an amplitude Vamp1 of the first output signal Vx1 to an amplitude vamp2 of the second output signal Vx2.

When (Ibias2=Iss) and (Ibias1=0) at the time T2, the B-channel of the operational amplifier OP1 becomes active. At the time T2, the comparison determination circuit 18 compares the digital data Dy=2 with the digital data Dx=6, and outputs the up signal again.

Upon output of the up signal from the comparison determination circuit 18, the up-down counter 16 increases the digital data Dy by one, to set Dy=3. When Dy=3 is inputted, the decoder circuit 14 turns on a switch SW3*a* of the first switch group SWb and turns off a switch SW1*a*. At this time, the amplitude of the first output signal Vx1 is switched to Vamp3. Since Dy is an odd number, the second switch group SWb is not switched.

The synchronized signal SYNC is inputted again into the time constant circuit 32, to decrease the bias current Ibias2 according to the time constant and increase the bias current Ibias1. The active channel of the operational amplifier OP1 is switched from B to A along with the change in bias current. More specifically, during the transition period of the time constant circuit 32 from the time T1 to the time T2, the amplitude of the output signal Vout of the variable gain amplifier 200 gradually changes from an amplitude Vamp2 of the second output signal Vx2 to an amplitude vamp3 of the first output signal Vx1.

After the time T3, by repetition of the same operation as described above, the digital data Dy gradually increases and the amplifier of the output signal Vout gradually decreases by operation of the comparison determination circuit 18 and the up-down counter 16, to switch the volume. When the digital data Dx=Dy at the time T6 and a desired volume value is obtained, the comparison determination circuit 18 outputs a stop signal. The up-down counter 16 stops increasing and decreasing the digital data Dy upon input of the stopping signal.

As thus described, according to the variable gain amplifier 200 of the present preferred embodiment, when the microcomputer 230 instructs the volume control signal VOL after the change, the comparison determination circuit 18 and the up-down counter 16 automatically make the volume automatically get closer to a desired value step by step.

If the up-down counter 16 and the comparison determination circuit 18 are not provided, it is necessary in the microcomputer 230 to rewrite the resistor circuit 20 on an as-needed basis until the volume value changes from the current one to the one as the target, thereby leading to an increase in load of the microcomputer 230. When data that corresponds to the volume value as the target is directly written into the resistor circuit 20, the amplitude of the output signal suddenly changes in a case where the difference between the volume value as the target and the current volume value is significantly large, causing occurrence of noise. According to the variable gain amplifier 200 of the present preferred embodiment, the amplitude of the signal outputted from the speaker SP1 is modestly switched to reduce occurrence of noise and also reduce the load of the microcomputer 230.

The present preferred embodiment is an exemplification of the present invention, and it is understood by a person skilled in the field that various modified examples of combinations of constituent elements and processes are possible and those modified examples also fall within the range of the present invention.

Figure 7A:
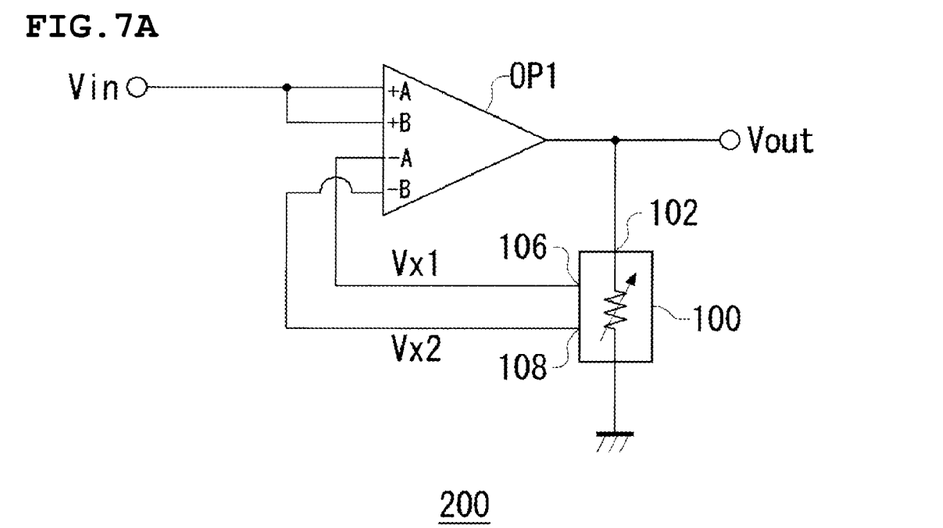
FIGS. 7A and 7B are circuit diagrams each showing a modified example of the variable gain amplifier of FIG. 2.
Figure 7B:
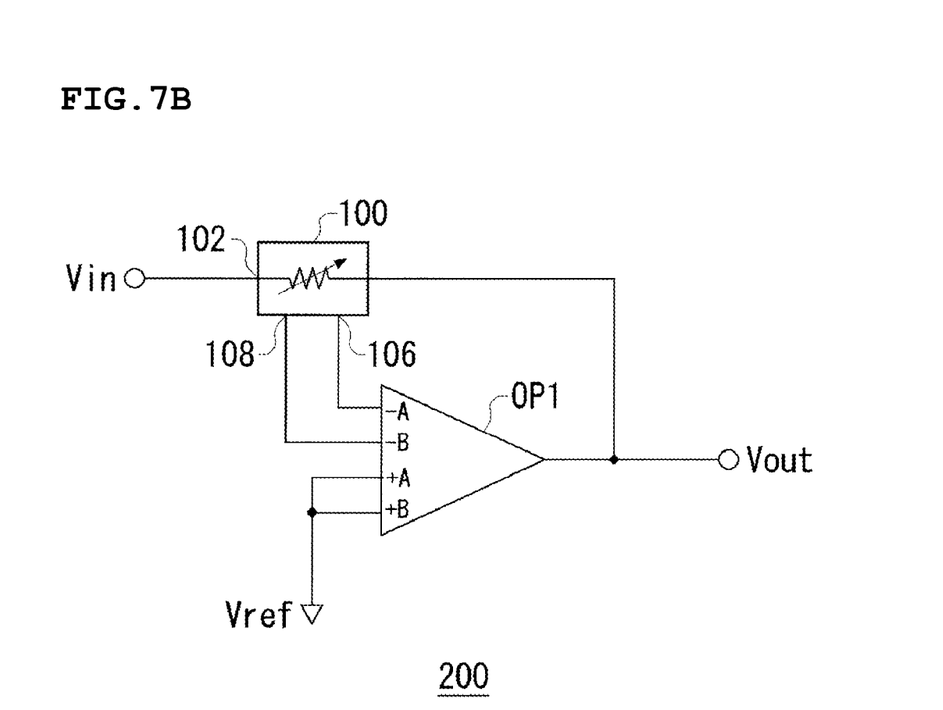

FIGS. 7A and 7B are circuit diagrams showing modified examples of the variable gain amplifier 200 of FIG. 2.

The variable gain amplifier 200 of FIG. 7A preferably includes the attenuator 100 and the operational amplifier OP1. An input signal Vin to be amplified by the variable gain amplifier is inputted into the first non-inverting input terminal (+A) and the second non-inverting input terminal (+B). The first output terminal 106 and the second output terminal 108 of the attenuator 100 are connected to the first inverting input terminal (−A) and the second inverting input terminal (−B). The variable gain amplifier 200 as thus configured is a non-inverting type amplifier using the attenuator 100 of FIG. 2 as the feedback resistance, and is capable of changing a feedback resistance value to modestly change a gain.

The variable gain amplifier 200 of FIG. 7B also includes the attenuator 100 and the operational amplifier OP1. In this variable gain amplifier 200, the other end of the resistance group 10 of the attenuator 100 is connected to the output terminal of the operational amplifier OP1 instead of being grounded. A reference voltage Vref outputted from the voltage source is inputted into the first non-inverting input terminal (+A) and the second non-inverting input terminal (+B) of the operational amplifier OP1. Further, the first output terminal 106 and the second output terminal 108 of the attenuator 100 are connected respectively to the first inverting input terminal (−A) and the second inverting input terminal (−B).

The variable gain amplifier 200 as thus configured is an inverting type amplifier using the attenuator 100 of FIG. 2 as the feedback resistance, and is capable of changing a value of the feedback resistance to modestly change the gain.

In the present preferred embodiment, the digital data Dy was counted up or down by one when the up signal or the down signal was inputted into the up-down counter 16. However, this is not restrictive of the present invention, and the digital data Dy may be counted up or down by two or more steps. The number of steps being counted each time may be set in a range where no noise occurs.

Further, the count step may be variable. The noise that occurs at the time of changing the volume depends upon an absolute value of variation of the amplitude of the output signal Vout. Therefore, for example, when the amplitude of the output signal Vout is large, the count step is set to small so that the change in amplitude is set to small. Further, when the amplitude of the output signal Vout is small, the count step may be set to large. In this case, it is possible to reduce time elapsed until completion of transition to a desired volume while occurrence of noise is suppressed.

Here, since the amplitude of the output signal Vout depends upon the attenuation factor of the attenuator 100 and the amplitude of the input signal Vin, the count step of the up-down counter 16 may be switched according to either the attenuation factor or the input signal Vin. When the count step is changed according to the attenuation factor of the attenuator 100, such a setting is considered where a step-1 is a range of the digital data Dy between Dy1 and Dy2, a step-2 is a range between Dy2 and Dy3, and a step-4 is a range between Dy3 and Dy4.

Further, the amplifier 30 shown in FIG. 4, and FIGS. 7A and 7B may include three or more differential input terminals. For example, when the amplifier 30 includes three differential input terminals, the operational amplifier OP1 of FIG. 5 may be provided with three differential pairs and the time constant circuit 32 may produce three bias currents Ibias1 to Ibias3 with respect to the respective differential pairs. Further, the attenuator 100 shown in FIGS. 2 and 3 may be provided with first to third output terminals, and the respective output terminals may be provided with first to third switch groups. In the same manner, an even larger number of differential input pairs may be provided.

In the present preferred embodiment, the case was described where the respective switches included in the first switch group SWa and the second switch group SWb are alternately connected to the connection node of the resistance group 10. However, this is not restrictive of the present invention, and all switches included in the first switch group SWa and the second switch group SWb may be provided at all connection nodes when there is a sufficient circuit area.

Further, the present invention described by the foregoing preferred embodiments can also be expressed as follows.

Another preferred embodiment of the present invention relates to an attenuator which attenuates input signals and outputs the signals to an amplifier arranged to amplify signals applied to two input terminals. This attenuator preferably includes first and second output terminals to be respectively connected to the two input terminals of the amplifier, a resistance group having a plurality of resistances connected in series, in which the input signal is applied to one end of the resistance group while the other end thereof is grounded, a first switch group including a plurality of switches provided between connection nodes of the first output terminal and the plurality of resistances, a second switch group including a plurality of switches provided between connection nodes of the second output terminal and the plurality of resistances, a comparison determination circuit arranged to compare a data variable corresponding to a current attenuation factor with target data corresponding to an attenuation factor as a target value, to output an up signal or a down signal, an up-down counter arranged to increase or decreasing the data variable based upon the up signal or the down signal which is outputted from the comparison determination circuit, and a decoder circuit arranged to select one switch, corresponding to the data variable outputted from the up-down counter, from each of the first switch group and the second switch group, and turning on the switches.

According to this mode, the decoder circuit controls selection of the switch via the decoder circuit to enable control of a partial pressure ratio of the resistance so as to change the attenuation factor stepwise.

A plurality of switches included in the first switch group and the second switch group may be alternately connected to the connection node of the plurality of resistances included in the resistance group.

In this case, since one switch is connected to the connection node of the plurality of resistances, an increase in circuit scale can be minimized so as to attempt to improve wiring efficiency.

The count step of the up-down counter may be variable. Controlling the count step according to the amplitude of the input signal can make a change in attenuation factor close to a desired curve.

The attenuator may further include a resistor circuit arranged to hold target data. In this case, writing desired target data into the resistor circuit from the outside via the microcomputer or the like causes the attenuation factor of the attenuator to gradually approach a value corresponding to the target data.

Another preferred embodiment of the present invention is a variable gain amplifier. This variable gain amplifier preferably includes an attenuator as described above, an operational amplifier including a first differential pair corresponding to a first non-inverting input terminal and a first inverting input terminal, a second differential pair corresponding to a second non-inverting input terminal and a second inverting input terminal, and a current mirror load provided in common in the first and second differential pairs, and a feedback route from an output terminal of the operational amplifier to the first and second inverting input terminals. The first and second output terminals of the attenuator are connected to the first and second non-inverting input terminals of the operational amplifier, and a signal to be amplified by the variable gain amplifier as the input signal is inputted into the attenuator.

The operational amplifier alternately switches the differential pairs to active according to a predetermined time constant. According to this mode, the amplitude of the signal to be inputted into the operational amplifier is gradually switched, thereby allowing modest change in amplitude of the signal.

Still another preferred embodiment of the present invention is also a variable gain amplifier. This variable gain amplifier preferably includes an attenuator as described above, and an operational amplifier, including a first differential pair corresponding to a first non-inverting input terminal and a first inverting input terminal, a second differential pair corresponding to a second non-inverting input terminal and a second inverting input terminal, and a current mirror load provided in common in the first and second differential pairs. A signal to be amplified by the variable gain amplifier is inputted into the first and second non-inverting input terminals of the operational amplifier, and the first and second output terminals of the attenuator are connected to the first and second inverting input terminals.

The use of the foregoing attenuator as the feedback resistance to be provided between the output terminal of the operational amplifier and the inverting terminal enables configuration of the non-inverting input type variable gain amplifier so as to gradually switch the gain.

Still another preferred embodiment of the present invention is also a variable gain amplifier. This variable gain amplifier preferably includes an operational amplifier, including a first differential pair corresponding to a first non-inverting input terminal and a first inverting input terminal, a second differential pair corresponding to a second non-inverting input terminal and a second inverting input terminal, and a current mirror load provided in common in the first and second differential pairs, a feedback resistance having a plurality of resistances connected in series, in which the input signal is applied to one end of the resistance group while the other end thereof is connected to the output terminal of the operational amplifier, a voltage source arranged to apply a reference voltage to the first and second non-inverting input terminals of the operational amplifier, a first switch group including a plurality of switches provided between connection nodes of the first inverting input terminal of the operational amplifier and the plurality of resistances, a second switch group including a plurality of switches provided between connection nodes of the second inverting input terminal of the operational amplifier and the plurality of resistances, a comparison determination circuit arranged to compare a data variable corresponding to a current gain with target data corresponding to a gain as a target value, to output an up signal or a down signal, an up-down counter arranged to increase or decreasing the data variable based upon the up signal or the down signal which is outputted from the comparison determination circuit, and a decoder circuit arranged to select one switch, corresponding to the data variable outputted from the up-down counter, from each of the first switch group and the second switch group, and turning on the switches.

According to this mode, in the inverting type variable gain amplifier including the feedback resistance between the output terminal of the operational amplifier and the inverting input terminal, switching the resistance partial pressure ratio of the feedback resistance according to the output of the up-down counter allows gradual switching of the gain.

The bias currents of the first and second differential pairs of the operational amplifier may be controlled in synchronism with the up-down counter. In this case, since the active differential pair of the operational amplifier is controlled in synchronism with the up-down counter, it is possible to switch the gain of the variable gain amplifier more smoothly.

An audio signal may be inputted into the variable gain amplifier as the signal to be amplified. In this case, the gain of the variable gain amplifier corresponds to a volume. Gradually changing the gain of the variable gain amplifier allows reduction in distortion of the audio signal in switching the volume.

The variable gain amplifier may be integrally integrated on one semiconductor substrate or may have any other suitable construction.

Still another preferred embodiment of the present invention is an electronic apparatus. This electronic apparatus includes at least one sound output element, a variable gain amplifier as described above arranged to output an audio signal amplified to the sound output portion, and a microcomputer arranged to instruct the variable gain amplifier to amplify a specific gain corresponding to a volume. The at least one sound output element preferably may include a speaker and earphone. According to this mode, by setting the volume value after change by the microcomputer, the gain of the variable gain amplifier is switched in a stepwise manner. This allows reduction in load of the microcomputer as well as prevention of occurrence of unnecessary noise from the sound output portion.

It is to be noted that those obtained by arbitrary combination of the above-mentioned constituents or mutual replacement of methods, devices, systems and the like of the constituent elements and expression of the present invention are also effective as preferred embodiments of the present invention.

According to the attenuator and the variable gain amplifier of various preferred embodiments of the present invention, the attenuation factor or the gain can be switched in a stepwise manner in the circuit, thereby enabling reduction in load of an external microcomputer and the like.

While preferred embodiments and examples of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An attenuator, which attenuates input signals and outputs the attenuated signals to an amplifier arranged to amplify signals applied to two input terminals of the amplifier, the attenuator comprising:
   first and second output terminals to be respectively connected to the two input terminals of the amplifier;
   a comparison determination circuit arranged to compare a data variable corresponding to a current attenuation factor with target data corresponding to an attenuation factor defining a target value, to output an up signal or a down signal; and
   an up-down counter arranged to increase or decrease the data variable based upon the up signal or the down signal which is outputted from the comparison determination circuit; wherein
   the input signals respectively attenuated by different attenuation factors are outputted to the first and second output terminals based upon the data variable outputted from the up-down counter.

2. The attenuator according to claim 1, wherein a counting step of the up-down counter is variable.

3. The attenuator according to claim 1, further comprising a resistor circuit arranged to hold the target data.

4. A variable gain amplifier, comprising:
   an attenuator according to claim 1;
   an operational amplifier, including a first differential pair corresponding to a first non-inverting input terminal and a first inverting input terminal, a second differential pair corresponding to a second non-inverting input terminal and a second inverting input terminal, and a current mirror load provided in common in the first and second differential pairs; and a feedback route from an output terminal of the operational amplifier to the first and second inverting input terminals; wherein the first and second output terminals of the attenuator are connected to the first and second non-inverting input terminals of the operational amplifier, and a signal to be amplified by the variable gain amplifier as the input signal is inputted to the attenuator.

5. The variable gain amplifier according to claim 4, wherein bias currents of the first and second differential pairs of the operational amplifier are controlled in synchronization with the up-down counter.

6. The variable gain amplifier according to claim 5, wherein an audio signal is the signal to be amplified.

7. An electronic apparatus comprising:
at least one sound output element;
a variable gain amplifier according to claim 6 arranged to output an audio signal amplified to the at least one sound output element; and
a microcomputer arranged to instruct the variable gain amplifier to amplify a specific gain corresponding to a desired volume.

8. An attenuator which attenuates input signals and outputs the signals to an amplifier arranged to amplify signals applied to two input terminals of the amplifier, the attenuator comprising:
first and second output terminals arranged to be respectively connected to the two input terminals of the amplifier;
a resistance group having a plurality of resistances connected in series, in which the input signal is applied to one end of the resistance group while the other end of the resistance group is grounded;
a first switch group including a plurality of switches provided between connection nodes of the first output terminal and the plurality of resistances;
a second switch group including a plurality of switches provided between connection nodes of the second output terminal and the plurality of resistances;
a comparison determination circuit arranged to compare a data variable corresponding to a current attenuation factor with target data corresponding to an attenuation factor as a target value, to output an up signal or a down signal;
an up-down counter arranged to increase or decrease the data variable based upon the up signal or the down signal which is outputted from the comparison determination circuit; and
a decoder circuit arranged to select one switch, corresponding to the data variable outputted from the up-down counter, from each of the first switch group and the second switch group, and to turn on the switches.

9. The attenuator according to claim 8, wherein the plurality of switches included respectively in the first switch group and the second switch group are alternately connected to the connection node of the plurality of resistances included in the resistance group.

10. The attenuator according to claim 8, wherein a counting step of the up-down counter is variable.

11. The attenuator according to claim 8, further comprising a resistor circuit arranged to hold the target data.

12. A variable gain amplifier, comprising:
an attenuator according to claim 8;
an operational amplifier, including a first differential pair corresponding to a first non-inverting input terminal and a first inverting input terminal, a second differential pair corresponding to a second non-inverting input terminal and a second inverting input terminal, and a current mirror load provided in common in the first and second differential pairs; and a feedback route from an output terminal of the operational amplifier to the first and second inverting input terminals; wherein the first and second output terminals of the attenuator are connected to the first and second non-inverting input terminals of the operational amplifier, and a signal to be amplified by the variable gain amplifier as the input signal is inputted into the attenuator.

13. The variable gain amplifier according to claim 12, wherein bias currents of the first and second differential pairs of the operational amplifier are controlled in synchronization with the up-down counter.

14. The variable gain amplifier according to claim 12, wherein an audio signal is the signal to be amplified.

15. A variable gain amplifier, comprising:
an operational amplifier, including a first differential pair corresponding to a first non-inverting input terminal and a first inverting input terminal, a second differential pair corresponding to a second non-inverting input terminal and a second inverting input terminal, and a current mirror load provided in common in the first and second differential pairs;
a feedback resistance having a plurality of resistances connected in series, in which the input signal is applied to one end of the resistance group while the other end of the resistance group is connected to the output terminal of the operational amplifier;
a voltage source arranged to apply a reference voltage to the first and second non-inverting input terminals of the operational amplifier;
a first switch group including a plurality of switches provided between connection nodes of the first inverting input terminal of the operational amplifier and the plurality of resistances;
a second switch group including a plurality of switches provided between connection nodes of the second inverting input terminal of the operational amplifier and the plurality of resistances;
a comparison determination circuit arranged to compare a data variable corresponding to a current gain with target data corresponding to an attenuation factor as a target value, to output an up signal or a down signal;
an up-down counter arranged to increase or decrease the data variable based upon the up signal or the down signal which is outputted from the comparison determination circuit; and
a decoder circuit arranged to select one switch, corresponding to the data variable outputted from the up-down counter, from each of the first switch group and the second switch group, and to turn on the switches.

16. An attenuator, which attenuates an input signal and outputs the signal, comprising:
first and second output terminals to be respectively connected to two input terminals of an amplifier;
a comparison determination circuit arranged to compare data corresponding to an attenuation factor currently held in the attenuator with target data corresponding to an attenuation factor calculated outside the attenuator as a target value, and to output an up signal or a down signal based upon the comparison result;
an up-down counter arranged to increase or decrease the data corresponding to the attenuation factor currently held in the attenuator, based upon the up signal or the down signal outputted from the comparison determination circuit;

a resistor circuit arranged to hold the target data;

an operational amplifier, including a first differential pair corresponding to a first non-inverting input terminal and a first inverting input terminal, a second differential pair corresponding to a second non-inverting input terminal and a second inverting input terminal, and a current mirror load provided in common in the first and second differential pairs; and a feedback route from an output terminal of the operational amplifier to the first and second inverting input terminals; wherein signals respectively attenuated by different attenuation factors are outputted to the first and second output terminals based upon the data corresponding to the attenuation factor currently held in the attenuator, which is outputted from the up-down counter; and the first and second output terminals are connected to the first and second non-inverting input terminals of the operational amplifier, and a signal to be amplified by the variable gain amplifier as the input signal is inputted into the attenuator.

17. An attenuator, comprising:

a comparison determination circuit having a plurality of first inputs and first outputs;

an up-down counter having a second input and a second output; and a decoder circuit having a third input and a third output; wherein the first output of the comparison determination circuit is connected to the second input of the up-down counter, the second output of the up-down counter is connected to one of the plurality of the first inputs; and the second output of the up-down counter is connected to the third input of the decoder circuit.

18. The attenuator according to claim 17, wherein the plurality of first inputs into the comparison determination circuit are data currently held by the attenuator and target data as a target value, and a comparison signal of the comparison determination circuit is the first output.

19. A variable gain amplifier, comprising:

an attenuator according to claim 18;

an operational amplifier including a first differential pair corresponding to a first non-inverting input terminal and a first inverting input terminal, a second differential pair corresponding to a second non-inverting input terminal and a second inverting input terminal, and a current mirror load provided in common in the first and second differential pairs; and a feedback route from an output terminal of the operational amplifier to the first and second inverting input terminals; wherein the first and second output terminals of the attenuator are connected to the first and second non-inverting input terminals of the operational amplifier, and a signal to be amplified by the variable gain amplifier as the input signal is inputted into the attenuator.

20. An attenuator, comprising:

a comparison determination circuit having a plurality of first inputs and first outputs; and an up-down counter having a second input and a second output;

the attenuator being arranged to attenuate an input signal and output the signal; wherein the first output of the comparison determination circuit is connected to the second input of the up-down counter;

the second output of the up-down counter is connected to one of the plurality of the first inputs; and the input signal is attenuated based upon the second output of the up-down counter, and then outputted by the attenuator.

* * * * *